United States Patent [19]
Caprari

[11] Patent Number: 4,575,636
[45] Date of Patent: Mar. 11, 1986

[54] DEEP ULTRAVIOLET (DUV) FLOOD EXPOSURE SYSTEM

[75] Inventor: Fausto Caprari, East Brunswick, N.J.

[73] Assignee: RCA Corporation, Princeton, N.J.

[21] Appl. No.: 605,244

[22] Filed: Apr. 30, 1984

[51] Int. Cl.[4] .......................................... H01L 21/26
[52] U.S. Cl. .............................. 250/492.1; 250/504 R
[58] Field of Search ............ 250/493.1, 504 R, 593.1, 250/503.1, 492.1, 453.1, 454.1, 455.1; 313/113, 110, 111; 350/629, 630; 362/310, 347, 350

[56] References Cited

U.S. PATENT DOCUMENTS

| | | | |
|---|---|---|---|
| 2,356,592 | 8/1944 | Kolbert et al. | 250/504 |
| 3,911,318 | 10/1975 | Spero et al. | 315/39 |
| 3,983,039 | 9/1976 | Eastland | 250/492 R |
| 4,023,904 | 5/1977 | Sheets | 250/492.2 |
| 4,055,769 | 10/1977 | Sander | 250/492.1 |
| 4,243,917 | 1/1981 | Caprari | 315/241 R |
| 4,298,005 | 11/1981 | Mutzhas | 128/396 |
| 4,398,094 | 8/1983 | Hiramoto | 250/492.1 |

OTHER PUBLICATIONS

Allen, Foster, Yen, "Deep U.V. Hardening of Positive Photoresist Patterns," J. Electrochemical Soc., Jun. 1982, vol. 129, pp. 1379-1381.
Fusion Systems Corp., Fusion UV Curing Systems, 1982, SB 536 8-82-5M.
Ruggerio, "Positive Photoresist Polymerization Through Pulsed Photomagnetic Curing," Solid State Technology/Mar. 1984, pp. 165-169.
Lin, "Multi-Layer Resist Systems as a Means to Submicron Optical Lithography," IEDM 1982, pp. 391-393.
Griffing, "An Operational Two Level Photoresist Technology," IEDM 1981, pp. 562-565.
Ma, "Plasma Resist Image Stabilization Technique (PRIST) Update," SPIE, vol. 333, Submicron Lithography (1982), pp. 19-23.

Primary Examiner—Bruce C. Anderson
Assistant Examiner—Paul A. Guss
Attorney, Agent, or Firm—Birgit E. Morris; Donald S. Cohen; Joseph D. Lazar

[57] ABSTRACT

Apparatus for flood exposing deep ultraviolet (DUV) photoresist material from a xenon lamp source providing pulsed radiation in the DUV range formed into an annular beam by a paraboloid reflector. The radiation beam is substantially collimated with a preferred divergence of 4° for mask (imaging) development. Wafers having single-layer or multi-layer photoresist material sensitive to UV radiation are flood exposed to achieve, with high resolution, imaging, even if the photoresist layers are thin. The apparatus is also used to cure DUV-sensitive photoresist material with the radiation beam having the same or preferably greater divergence. The photoresist material is flood exposed for either imaging or curing that is both rapid and uniform.

9 Claims, 2 Drawing Figures

DEEP ULTRAVIOLET (DUV) FLOOD EXPOSURE SYSTEM

This invention relates to an apparatus for flood exposing with deep ultraviolet (DUV) radiation a plurality of substrates, such as wafers, each having a coating of photoresist material.

BACKGROUND OF THE INVENTION

In the processing of semiconductor products of the type used for very large scale integrated (VLSI) circuit devices to either image or cure the photoresist material for the very small geometries required is difficult for several reasons. One of the essential requirements of a photoresist is its ability to withstand high temperatures while retaining control of both edge profile and line dimensions. It is known that, in order to fabricate VLSI devices, reactive ion etching (RIE) in a plasma chamber is essential to reproduce the photoresist geometry required. Sometimes the temperature in the plasma chamber can be so high that it causes the photoresist material to flow, if not to burn. Moreover, the choices of photoresist materials and the materials to be etched are very limited when RIE is to be performed. Accordingly, high temperatures and tougher resist materials are required for RIE for curing and stabilization procedures.

Photoresist material sensitive to deep ultraviolet (DUV) exposure is being used more widely in this art to overcome the problems of RIE outlined above. For example, poly(methylmethacrylate) (PMMA) is being widely used in conjunction with diazo-type photoresists, such as Kodak 809 or Shipley AZ 1350J positive photoresist material. They are used to provide so-called double-layer or multi-layer photoresists for certain advantages in the curing and imaging steps. See the article by B. J. Lin entitled, "Multi-Layer Resist Systems as a Means to Submicron Optical Lithography," IDEM 1982, pages 391–394, and the article by B. F. Griffing entitled, "An Operational Two Level Photoresist Technology," IDEM 1981, pages 562–565, for detailed descriptions of such multi-layer resist systems.

There are known apparatus for improving the thermal properties of photoresists, such as PRIST (Photo Resist Image Stability Technique), described by W. H. L. Ma, "Plasma Resist Image Stabilization Technique (PRIST) Update," *Proc. Submicron Lithography*, vol. 333, pp. 19–23, SPIE, Bellingham, WA, 1982, or DUV treatment of photoresists followed by a high temperature bake as described by R. Allen, M. Foster, Y. T. Yen, "Deep U.V. Hardening of Posistive Photoresist Patterns," *J. Electrochemical Soc.*, vol. 129, pp. 1379–1381, 1982. However, the disadvantage of the PRIST system is that the process needs a plasma etcher which is very complex and costly. Moreover, it is very difficult to install production photoresist stablization equipment for such processes. The Fusion Corporation of Rockville, Md. provides a DUV apparatus that utilized microwave energy to excite a mercury vapor lamp. However, the disadvantage of this DUV approach is that the apparatus is bulky and generates a lot of heat.

In the art of flood exposure for either curing a photoresist material or exposing the photoresist material, as for multi-level pattern image processing, the illumination apparatus must not overheat the resist material. In spite of the efforts, for example, as outlined above, there is a need in the art for apparatus for flood exposing photoresist material rapidly and with good resolution either for imaging purposes or for curing the material without damaging it.

Griffing, cited above, for example, describes a DUV blanket exposure equipment using a cadmium (Cd) arc lamp. Since the radiation from a Cd arc lamp is not collimated, Griffing describes the use of a baffle structure to provide some collimation of the beam by absorbing the stray radiation that is not substantially collimated. A cylindrical reflector is used to guide the radiation from the source to the wafers. Griffing describes that the critical limitation of the cut-off angle of approximately 20° was required.

SUMMARY OF THE INVENTION

According to the apparatus of the present invention, a nearly collimated beam of DUV radiation is applied to the surface of substrates, such as wafers, having a coating of photoresist material. The radiation is derived from a tubular xenon lamp, the radiation from which is reflected by a paraboloid reflector to develop an annular beam of DUV irradiating energy.

DETAILED DESCRIPTION OF THE PREFERRED EMBODIMENT

Figure 1:
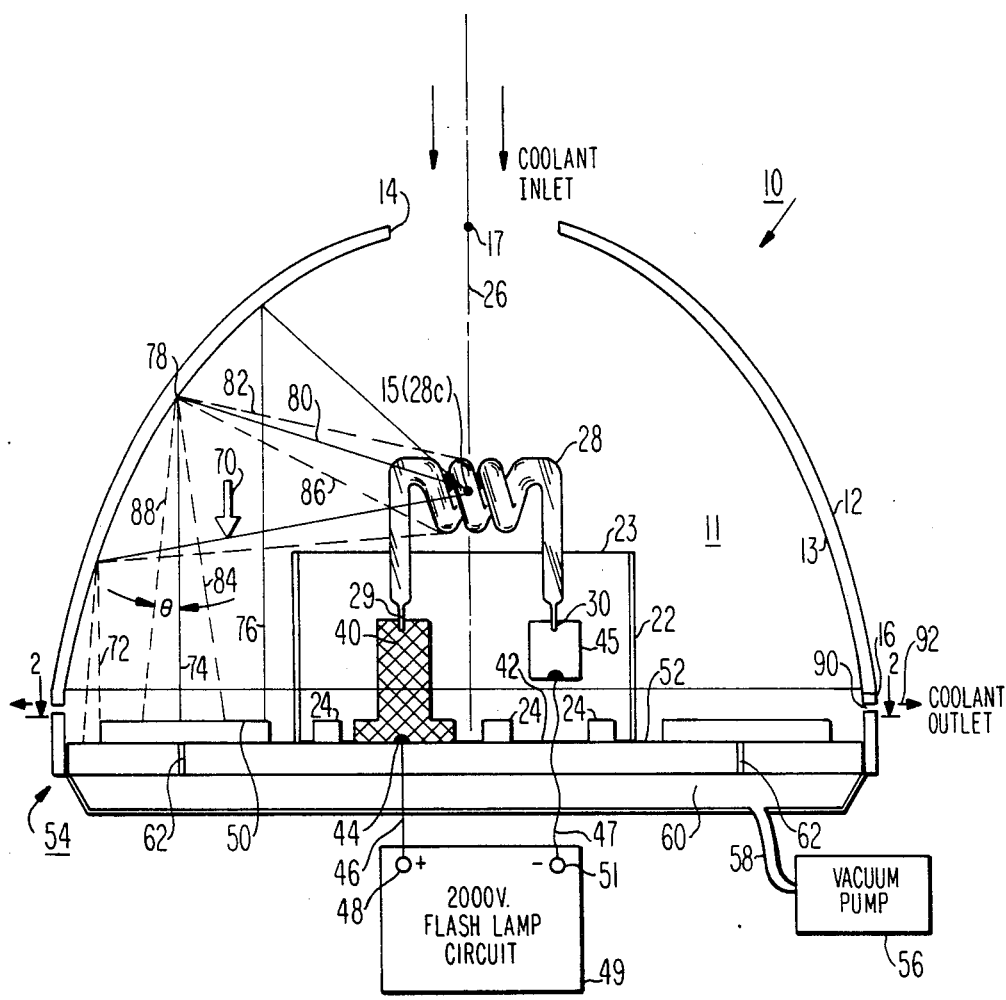
FIG. 1 is a schematic of the apparatus of one embodiment of the invention.

The present invention is concerned with providing DUV radiation to photoresist surfaces for multi-level imaging or for curing the photoresist material.

The apparatus 10, according to one embodiment of the invention, is formed of a paraboloid reflector 12 having an inner surface 13, a central opening 14 and a cylindrical skirt 16. A chamber 11 is defined thereby within the reflector 12. The optical axis of the reflector is designated 26. The paraboloidal reflector 12 is the type in which the rays parallel to the axis 26 of the reflector are reflected through the focus 15. The location of the focus 15 is usually found by experimentation. A suitable reflector used in the practice of the invention is a type 02 RPM 029 paraboloidal reflector available from the Melles Griot Company of Irvine, Calif.

A wafer chuck 54 for supporting a plurality of wafers 50 on a surface 52 in an annular array includes a vacuum pump 56 coupled via a flexible hose 58 to a vacuum chamber 60. Chamber 60 provides a holding vacuum to each wafer 50 via ducts 62. Chuck 54 is suitably arranged to be removed from apparatus 10 to add and remove the wafers 50 after each operation.

A tubular shield 22 having an open end 23 and a plurality of vent openings 24 is positioned along the optical axis 24 of the reflector on the upper surface 52 of chuck 54. The shield 22 is formed preferably of a non-reflecting metal such as copper or aluminum coated with polytetrafluoroethylene, commonly known as Teflon, a proprietary trademark of the DuPont Company.

A tubular lamp 28 has, at its remote ends, an anode electrode 29 and a cathode electrode 30. The tube 28 is preferably wound in a helix with two or three tightly coupled turns. The tube of the lamp 28 contains xenon gas and is the type which is available from a vendor, such as ILC Technology of Sunnyvale, Calif., Model L-4875. The diameter of the turns of the helix of the lamp 28 are about one inch and the overall length of the helix is also about one inch. Accordingly, as a source of radiation, the lamp 28 will appear to be and thus simulate a spherical source of radiation.

Lamp 28 is structurally supported within the chamber 11 by metallic conductive post 40 supported on the surface 52. A terminal 44 on post 40 is connected to a conductor 46 which in turn is connected to the positive terminal 48 of a flash lamp circuit 49. The cathode 30 is connected to a non-supported or, what may be termed a floating cathode terminal 45, connected, in turn, by conductor 47 to negative terminal 51 of circuit 49. With this arrangement of the lamp 28, the electrodes 29 and 30 do not interfere with radiation that is reflected from the inner surface 13 of the reflector 12.

The lamp 28 is energized by the flash lamp circuit 49 via electrodes 29 and 30. While lamp 28 may be in the form of a straight tube, it is preferably in helical form. A suitable lamp circuit is disclosed in my U.S. Pat. No. 4,243,917, issued Jan. 6, 1981.

Circuit 49 is arranged to provide energy to lamp 28 to develop five millijoules per square centimeter at each of the surfaces of wafers 50 in a flash of about three milliseconds duration. In typical operation, about 90 flashes for each dose is required to cure a group of six four-inch wafers provided with a positive photoresist coating. Accordingly, 450 millijoules is an appropriate dose of DUV radiation from the aggregate of the repeated flashes of the xenon lamp 28 to cure or stabilize a coating of photoresist material.

The xenon lamp 28, when operated at high current densities, that is, at about 3,000 amperes per square centimeter, provides high radiation output capabilities in the DUV spectral range of 200-320 nanometers. As indicated above, the DUV range of radiation has been found to be extremely effective in either pattern exposure, i.e. imaging, or curing of photoresist materials.

Since the lamp operates at relatively high temperatures, a coolant gas is passed into the chamber 11. The gas is forced downwardly through the aperture 14 and then through shield opening 23. The gas then passes over the lamp 28 directly and through apertures 24 in shield 22 and exits through apertures 90 in the skirt 16, as indicated by arrows 92. Nitrogen gas is advantageously used as a coolant to purge the chamber of ozone which has known adverse effects.

An annular or tubular radiation beam 70 is formed, according to conventional terminology in this art, of a plurality of bundles of essentially collimated reflected rays 72, 74, 76, etc. One such bundle 74 is reflected from point 78 on reflector surface 13 from ray 80 originating from the geometric center 28c of the xenon lamp 28. The geometric center 28c is made preferably coincident with the focus 15 of the reflector 12. Reflected ray 74 is parallel to the optical axis 26 since the incident ray 80 originated from the focus 15 of reflector 12. Ray 82, from the upper portion of lamp 28, will be reflected along path 84 while a ray 86, from the lower portion of the xenon lamp 28, will be reflected along path 88. Rays 84 and 86 are not collimated but are rather, divergent, since they did not originate from the focus 15. This sort of a reflection pattern occurs for each of the reflected light rays originating from the effectively distributed radiation sources forming the integrated output of lamp 28, with an average divergence angle $\theta$. There are, thus, divergent rays from a desired collimated beam. Excessive divergence may be undesirable if the apparatus is used for imaging. However, for use in curing a photoresist material, divergence may be desireable since it provides higher collection efficiency. The radiation source 28 is equivalent to a radiation source placed at a long distance from the surface of the wafers 50. While source 28 is not a point source, it is quite small and is nearly equivalent to a spherical source with a diameter of one inch (2.54 cm.).

The shield 22 functions to prevent any direct radiation from the lamp 28 being directed to wafers 50. All of the radiation that is developed in the beam 31 is reflected radiation and is essentially collimated and, thus, perpendicular to the wafers 50 on the surface 52.

Figure 2:
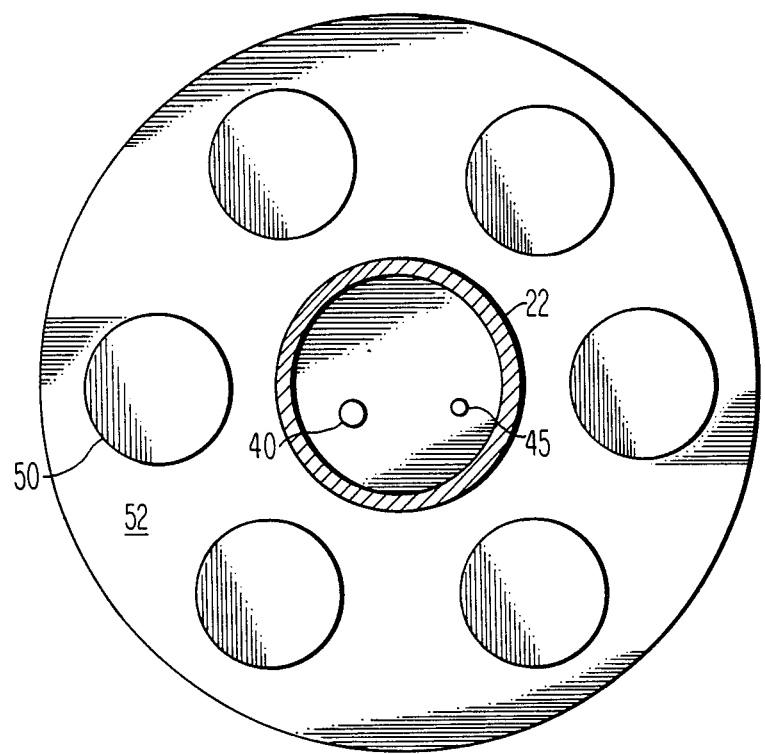
FIG. 2 is a view of FIG. 1 as seen along viewing line 2—2.

The individual wafers 50 are arranged in a circular pattern as shown in FIG. 2. Radiation beam 70 provides good uniformity of radiation in spite of the nonuniformity of the pulsed xenon flash lamp 28 provided the divergent angle $\theta$ is kept small. I find that 4° is a preferred angle for bi-level or multi-level photoresist image processing by which the radiation is used to expose the surface through a mask. However, for curing a photoresist, the divergence angle $\theta$ may be greater than 4° since a collimated beam is not required. Large divergent angles can be achieved by removing the shield 22 or defocusing the lamp 28, or both, as will be explained.

The xenon flash lamp 28 is provided with very large current-carrying electrodes 29 and 30 in order to carry a large current density of up to 5,000 amperes per square centimeter with negligible sputtering from the cathode 30.

In the preferred embodiment, as stated above, the center 28c of lamp 28 is coincident with the focus 15. The reflector 12 is selected to provide an optical path length of nine inches from the lamp 28 to the surface of the wafers. The divergence angle $\theta$ is thus 4°. If the lamp center 28c is positioned so as not to be coincident with the focus 15, the divergent angle $\theta$ will increase, as stated above. This defocused arrangement is useful for curing wafers. However, for exposing the surface to a substantially collimated beam, as required for mask development, the lamp 28 should be positioned at the focus 15.

Moreover, if the shield 22 is removed, as suggested above, the curing effect of the apparatus can be enhanced, since still more radiation will be directed to the wafer surface.

In practice, the invention is used to expose wafers 50 to radiation for either curing the polymers contained in the photoresist material or for pretreatment of multilayer photoresist imaging procedures as explained by the Lin article cited hereinabove. Many experiments have been performed that show the advantages of the apparatus described hereinabove for curing photoresists. For example, in one experiment, six four-inch wafers were coated with various positive and negative resists as follows: four wafers were coated with a Hunt positive resist (HPR204), and Dynachem OFPR 800, and two wafers were coated with a KTI negative resist (732).

The experiments showed that a very tough surface layer of photoresist material was developed by the DUV exposure from the apparatus 10. It showed that very small geometry was able to be developed. For example, VLSI device gates of 1.25 micrometers were accurately developed. Moreover, the plasma etch using the RIE technique was achievable on metal substrates. Furthermore, after the treatement by the DUV radiation, the adhesion of the various layers was improved, particularly for a thick oxide wet etch whereby no undercutting was manifested because the wafers could be baked at higher temperatures, for example, in the range of 125° to 200° C.

The invention is also useful, as stated above, in preparing multi-layer photoresist wafers for subsequent mask development. For an example of such use, a wafer is provided first with a relatively thick layer of PMMA photoresist covered by a relatively thin layer of diazo-type photoresist type AZ 1350 made by Shipley. First, the wafer is exposed to activate only the thin layer of the diazo-type photoresist without optically affecting the PMMA layer. Following the exposure of the thin layer, the wafer is exposed to the DUV beam, wherein the thin layer of the diazo-type photoresist acts as a mask for the PMMA layer. Accordingly, by this procedure of using the DUV radiation, one can develop a multi-layer photoresist pattern without the problems of the prior art. For example, in the prior art with such multi-layer photoresists, high temperature treatments either melt or chars the photoresist material. By first curing the surface layer with the DUV beam of radiation, the surface is stablized and thereby hardened for subsequent ion plasma etching or ion implantation.

What is claimed is:

1. An apparatus for flood exposing to deep ultraviolet (DUV) radiation a plurality of substrates arranged in an annular pattern, each substrate having a layer of photoresist material, comprising:

(a) a paraboloidal reflector having an optical axis and a focus;
   (b) means for providing a pulse of radiation including a tubular xenon lamp having a geometric center;
   (c) said lamp being positioned within said reflector so that the reflector focus is near or at the geometric center of the lamp to provide a reflected annular beam of radiation that is substantially collimated and parallel to said optical axis and having a predetermined divergence; and
   (d) means for positioning a plurality of said substrates in an annular planar pattern perpendicular to the path of said annular beam.

2. The apparatus of claim 1 wherein said lamp is formed in a short helix to simulate a spherical lamp source.

3. The apparatus of claim 1 further including a tubular shield positioned with its longitudinal axis coincident with said optical axis so as to block from said lamp direct radiation on said substrates.

4. The apparatus of claim 3 wherein the walls of said tubular shield have apertures for venting a coolant gas.

5. The apparatus of claim 1 wherein said paraboloidal reflector has an opening about said optical axis for passing a coolant gas under pressure into said paraboloidal reflector for cooling said lamp.

6. The apparatus of claim 3 wherein said lamp has an electrode at each of its respective ends extending in a direction parallel to the optical axis and said tubular shield.

7. The apparatus of claim 1 wherein said xenon lamp has a high radiance spectrum from 200 to 320 nanometers in the DUV range and further including means to energize said lamp to provide one or more high energy, short duration pulses of radiant energy of about five millijoules per square centimeter per flash.

8. The apparatus of claim 5 further including means for providing a coolant gas in a path passing over said substrates and upwardly through said opening.

9. The apparatus of claim 2 wherein said lamp has an overall dimension of one inch (2.5 cm.) whereby an optical path length of nine inches (22.9 cm.) from said lamp to said wafer surface provides a maximum beam divergence of 4°.

* * * * *